United States Patent [19]

Tada et al.

[11] Patent Number: 4,980,016
[45] Date of Patent: Dec. 25, 1990

[54] PROCESS FOR PRODUCING ELECTRIC CIRCUIT BOARD

[75] Inventors: Naoko Tada, Hino; Kunihiko Maeoka, Tokyo, both of Japan

[73] Assignee: Canon Kabushiki Kaisha, Tokyo, Japan

[21] Appl. No.: 892,086

[22] Filed: Aug. 1, 1986

[30] Foreign Application Priority Data

Aug. 7, 1985 [JP] Japan .............................. 60-172405
Aug. 8, 1985 [JP] Japan .............................. 60-173265

[51] Int. Cl.$^5$ .......................................... H01L 21/306
[52] U.S. Cl. ................................. 156/629; 156/902; 156/630; 156/666; 156/901; 156/233; 156/245; 156/246; 264/272.11; 264/272.17; 264/132
[58] Field of Search ............... 156/629, 631, 630, 662, 156/666, 901, 902, 233, 249, 247, 246, 245; 264/272.14, 272.17, 132, 272.11, 259

[56] References Cited

U.S. PATENT DOCUMENTS

| | | | |
|---|---|---|---|
| Re. 29,820 | 10/1978 | Konicek | 156/151 |
| 2,447,541 | 8/1948 | Sabre et al. | 156/233 |
| 2,464,157 | 3/1949 | Scheer | 156/233 |
| 2,585,700 | 2/1952 | Strickman | 156/233 |
| 3,135,823 | 6/1964 | Pritikin | 156/901 |
| 3,152,938 | 10/1964 | Osifchin et al. | 156/901 |
| 3,734,449 | 5/1973 | Itou et al. | 264/338 |
| 3,846,168 | 11/1974 | Elmore | 156/901 |
| 3,889,363 | 6/1975 | Davis | 156/233 |
| 3,990,926 | 11/1976 | Konicek | 156/151 |
| 4,116,753 | 9/1978 | Tojyo et al. | 156/233 |
| 4,264,549 | 4/1981 | Utner | 264/338 |
| 4,367,014 | 1/1983 | Howder | 156/233 |
| 4,606,787 | 8/1986 | Pelligrino | 156/233 |
| 4,650,545 | 3/1987 | Laakso et al. | 156/233 |
| 4,715,116 | 12/1987 | Thorpe et al. | 156/233 |

FOREIGN PATENT DOCUMENTS

| | | | |
|---|---|---|---|
| 1403815 | 5/1965 | France | 156/233 |
| 0264214 | 12/1985 | Japan | 156/233 |

*Primary Examiner*—David Simmons
*Assistant Examiner*—Lori Johnson
*Attorney, Agent, or Firm*—Fitzpatrick, Cella, Harper & Scinto

[57] ABSTRACT

A process for producing an electric circuit board comprises utilizing a transfer sheet, bearing an electric circuit pattern composed of a metal foil adhered onto a sheet substrate by means of an adhesive material, and transferring said electric circuit pattern onto a surface of an insulating resin substrate simultaneously with the molding thereof.

3 Claims, 3 Drawing Sheets

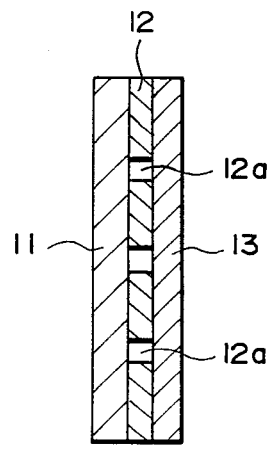
F I G. 6
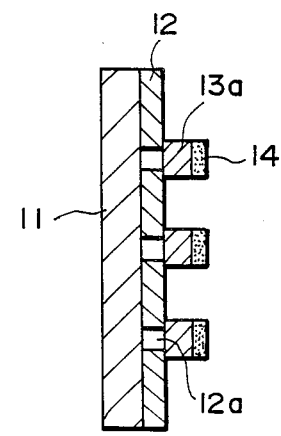
F I G. 7
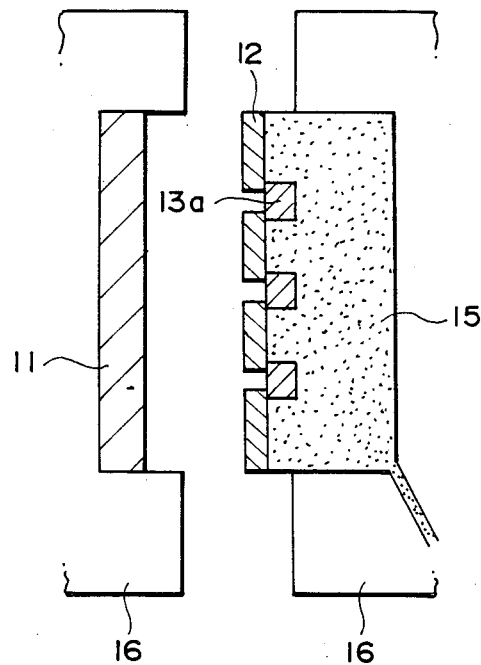
F I G. 8

PROCESS FOR PRODUCING ELECTRIC CIRCUIT BOARD

BACKGROUND OF THE INVENTION

1. Field of the Invention

The present invention relates to a process for producing an electric circuit board in which an electric circuit pattern is formed on the surface of an insulating substrate of synthetic resin simultaneously with the molding thereof.

2. Related Background Art

Conventionally an electric circuit pattern is formed on the surface of a molded product such as of resin either by a subtractive method in which a conductor such as a copper foil is adhered to a molded product and is etched in unnecessary portions, or by a full-additive method in which the surface of the molded product is subjected to a base treatment for improving adhesion strength, followed by addition of a catalyst to form plating nuclei and electroless plating, or a semi-additive method in which electroplating is employed in combination with electroless plating.

Also, there has been developed a method of printing electroconductive paint on the molded product, or a method of applying a sheet printed with electroconductive paint on the molded product and thermally transferring the paint thereto.

However, all of these methods requires, after the molding of a product, a step of forming an electric circuit pattern on the surface thereof.

The present inventors have therefore proposed a process of producing an electric circuit board having a circuit pattern on an insulating substrate, by charging a transfer sheet, bearing a circuit pattern on a sheet substrate in a metal mold for forming an insulating resin substrate and filling the mold with resin thereby transferring the circuit pattern of the transfer sheet onto the surface of the insultaing substrate simultaneously with the molding thereof. This process eliminates necessity of a separate step for forming the circuit pattern as a post-treatment and enables the very efficient manufacture of the electric circuit board.

However, the conventional transfer sheet employable in this process is prepared by printing, on a sheet substrate, a circuit pattern with conductive paint containing metal fillers such as silver, copper, nickel etc., and such conductive paint containing such filler shows a high electrical resistance. Therefore, the electric circuit to be produced by use of such a transfer sheet is associated with certain limitations, and such a process is not suitable for electric circuit boards requiring the application of a large current or those calling for formation of fine circuit patterns with narrower width, due to heat generation or current loss.

SUMMARY OF THE INVENTION

An object of the present invention is to provide a process for producing an electric circuit board allowing, by one efficient step, molding of an insulating substrate and formation of a circuit pattern and which is still capable of accepting a large applied current.

Another object of the present invention is to provide a process for producing an electric circuit board provided with an electric circuit pattern protected from oxidation.

Still another object of the present invention is to provide a process for producing an electric circuit board containing no adhesive material in a connector portion of the electric circuit pattern.

Still another object of the present invention is to provide an electric circuit board produced by one of the above-mentioned processes.

According to an aspect of the present invention, there is provided a process for producing an electric circuit board which comprises utilizing a transfer sheet, bearing an electric circuit pattern composed of a metal foil adhered onto a sheet substrate by means of an adhesive material, and transferring said electric circuit pattern onto a surface of an insulating resin substrate simultaneously with the molding thereof.

According to another aspect of the present invention, there is provided an electric circuit board produced by a process as described above.

BRIEF DESCRIPTION OF THE DRAWINGS

FIGS. 6 and 7 are schematic views showing another embodiment of the process for producing the transfer sheet to be employed in the present invention; and FIG. 8 is a schematic view showing another embodiment of the process of the present invention.

DESCRIPTION OF THE PREFERRED EMBODIMENT

The process of the present invention for producing an electric circuit board is characterized by utilizing a transfer sheet provided with a circuit pattern composed of a metal foil adhered on a sheet substrate by means of an adhesive material, and transferring said electric circuit pattern onto the surface of an insulating resin substrate simultaneously with the molding thereof.

The process of the present invention for producing an electric circuit board, being capable of forming the electric circuit pattern simultaneously with the molding of the insulating substrate, allows very easy and rapid production of the electric circuit board. The process of the present invention is effective also for producing an electric circuit board requiring application of a large current or calling for formation of a circuit pattern with a narrower width than previous circuit boards because the metal foil has a lower electric resistance than the conductive adhesive material.

Also, there can be obtained a highly reliable electric circuit board since the metal foil is more uniform in its electrical properties than the conductive adhesive material containing metal filler.

Figure 1:
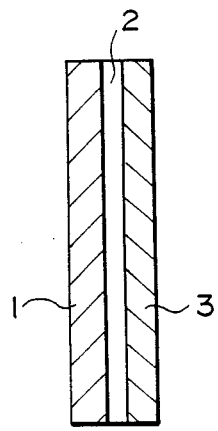
FIGS. 1 and 2 are schematic views showing an embodiment of the process for producing a transfer sheet to be employed in the present invention.
Figure 2:
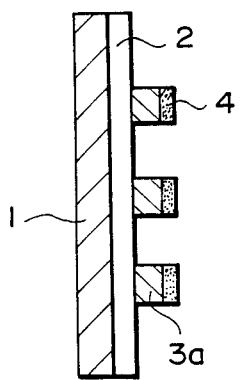

FIGS. 1 and 2 illustrate an embodiment of the process for producing a transfer sheet to be employed in the present invention. At first a metal foil 3 is adhered to a sheet substrate 1 by means of an adhesive material 2 (FIG. 1). For this purpose there can be advantageously employed the pressure of a heated laminater.

The sheet substrate 1 can be composed of a material with high mechanical strength and thermal resistance, such as polyethylene terephthalate or polyamide.

The metal foil 3 is preferably composed of copper, but there can also be employed other metals such as gold, silver, nickel etc. The thickness of the metal foil can be suitably selected so as to show an adequate electrical resistance according to the applied current, but is generally in a range from 20 to 100 μm.

The adhesive material 2 should be provided with a good heat resistance and an adhesion strength allowing the metal foil 3 to be peeled off from the sheet substrate 1 by the use of the transfer sheet as will be explained later, and is preferably composed of an epoxy adhesive.

Subsequently, unnecessary portions of the metal foil 3 on the sheet substrate 1 are etched off to form a circuit pattern 3a consisting of unelimated portions (FIG. 2). The etching step can be conducted by various methods, for example by printing resist ink 4 on the metal foil 3 by means of screen printing or the like, and dipping the exposed metal foil in a suitable etching liquid. This step leaves the metal foil only in portions covered by the resist ink 4, thus forming the circuit pattern 3a. The resist ink 4 is subsequently removed. The etching step may also be conducted by a photolithographic process.

Figure 3:
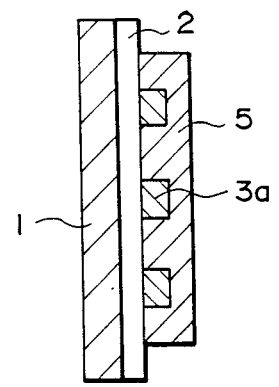
FIGS. 3 to 5 are schematic views showing an embodiment of the process of the present invention.
Figure 4:
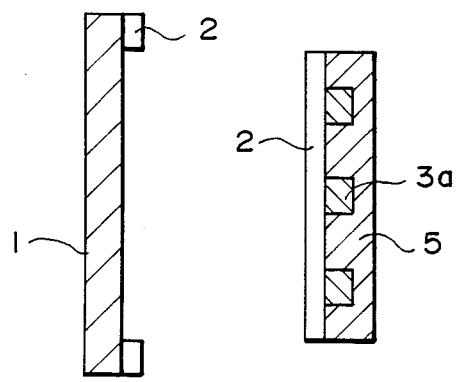
Figure 5:
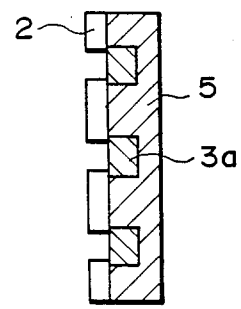

Now reference is made to FIGS. 3 to 5 for explaining the process of producing an electric circuit board by means of the transfer sheet thus prepared.

The transfer sheet is charged in the metal mold in such a manner that the circuit pattern bearing face thereof is directed toward the gate of the metal mold. Then the mold is closed, and the resin is injected into the mold and solidified (FIG. 3).

When the mold is opened, the circuit pattern 3a composed of metal foil is transferred onto the insulating substrate 5 of the molded resin product, thus providing an electric circuit board (FIG. 4).

At the time of opening said mold, the adhesive material 2 is often transferred, together with the circuit pattern, onto the electric circuit board, but such transferred adhesive material 2 is preferably not removed as it is effective for preventing oxidation of the circuit pattern 3a. However, as shown in FIG. 5, the adhesive material 2 present on a connector portion of the circuit pattern 3a is removed if necessary, and said connector portion is subjected to plating if required.

The adhesive material 2 may be positively transferred onto the substrate, by suitable selection of the adhesive material, resin temperature at the time of injection, etc.

FIGS. 6 and 7 are schematic views showing another embodiment of the process of the present invention, wherein a metal foil 13 is adhered onto a sheet substrate 11 by means, in the present embodiment, of an adhesive sheet 12 having a hole 12a in a predetermined position.

The adhesive sheet 12 is preferably of a type which exhibits adhesive power when heated.

The position of the hole 12a of the adhesive sheet 12 is determined in the following manner. In a succeeding step the unnecessary portions of the metal foil 13 are eliminated by etching to define a circuit pattern 13a from the unremoved portions, and the hole 12a is formed under a portion of the metal foil 13 constituting a connector portion in the circuit pattern 13a. The diameter of said hole 12a is selected to be just sufficient for the connection of a lead wire to the connector portion, and is preferebly smaller than the width of the circuit pattern 13a at the connector portion.

The hole 12a is formed in the adhesive sheet 12 preferably before the adhesive sheet 12 is placed on the sheet substrate 11, because of the simplicity of operation. However, it is also possible to form the adhesive sheet 12 with the hole 12a, by coating an adhesive in a sheet form on the substrate sheet 11 and forming a hole in the predetermined position.

Then, as explained above, the unnecessary portions of the metal foil 13 on the sheet substrate 11 are removed by etching to form the circuit pattern 13a composed of the unremoved portions (FIG. 7). The etching step can be achieved by various methods, for example by printing resist ink 14 on the metal foil 13 for example by screen printing and dipping the exposed metal foil 13 in a suitable etching solution. This operation leaves the metal foil only in the portions covered by the printed resist ink 14, thus forming the circuit pattern 13a. The resist ink 14 is subsequently removed. The etching step may also be conducted by a photolithographic process.

The transfer sheet prepared in the above-explained method is placed in a metal mold 16 shown in FIG. 8, which is then subjected to the steps of mold closing, resin injection, solidification by cooling and mold opening. In this manner an insulating substrate 15 of resin is molded and simultaneously the circuit pattern 13a is transferred onto the surface thereof, thus completing an electric circuit board. In this operation, the adhesive material constituting the adhesive sheet 12 is also transferred onto the electric circuit board (the transfer can be positively facilitated by suitable selection of various conditions such as the material constituting the adhesive sheet 12 or the resin temperature at the time of injection), and functions to prevent oxidation of the circuit pattern 13a, but the connector portion of the circuit pattern is not covered by the adhesive material due to the presence of the hole 12a in the adhesive sheet 12 and an additional removing step is unnecessary.

EXAMPLE

In the following there will be explained an example of the process shown in FIGS. 1 to 5.

On a polyethylene terephthalate sheet of 50μ thick, an electrolytic copper foil of 35μ thick was adhered by an epoxy adhesive employing a polyamide hardener, and the adhesive was hardened for 24 hours at 80° C.

Subsequently a masking pattern was formed on the copper foil by printing resist ink by screen printing method, and the copper foil was etched to form a pattern of a length of 100 mm and a line width of 0.5 mm.

The transfer sheet prepared in the above-explained manner was charged in a metal mold for injection molding in such a manner that the circuit pattern is directed toward the gate side. Then, ABS resin was molded with an injection pressure of 800 kg/cm$^2$ at a resin temparature of 230° C. After it was removed from the mold, the polyethylene terephthalate sheet was removed to obtain a molded product bearing a copper foil pattern thereon. The pattern showed same characteristics as prior to the molding in a conduction test effected after the adhesive material was partly removed from said pattern.

In the following there will be explained an example of the process shown in FIGS. 6 to 8.

In a film-formed adhesive material principally composed of modified epoxy resin there were formed holes of a diameter of 2 mm only in portions to constitute connectors. The film was used for adhering a polyethylene terephthalate sheet of 50μ thick and an electrolytic copper sheet of 35μ thick temporarily through heated rollers of 100° C., and the adhesive was hardened for 2 hours at 120° C. Subsequently, a pattern of a width of 0.5 mm, a length of 100 mm and a rand of 3 mm was screen printed with resist ink. After etching and removal of resist ink, the transfer sheet was charged in a metal mold in such a manner that the circuit pattern is directed toward the gate, and ABS resin was molded with an injection pressure of 950 kg/cm² at a resin temperature of 240° C. After the molded product was taken out from the mold, the polyethylene terephthalate film was removed to obtain a molded product bearing a circuit pattern in which the copper foil is exposed only in its connector portions. The circuit pattern showed same characteristics as prior to the molding in a conduction test.

What is claimed is:

1. A process for producing an electric circuit board comprising the steps of:

adhering an electric circuit pattern composed of a metal foil onto a sheet substrate of a transfer sheet by means of an adhesive material disposed on the non-connector portions of the electric circuit pattern; and transferring said electric circuit pattern onto a surface of an insulating resin substrate simultaneously with the molding thereof, and transferring the adhesive material onto a surface of the insulating resin substrate simultaneously with the transfer of said electric circuit pattern onto a surface of the insulating resin substrate, wherein said transfer step comprises the steps of:

charging said transfer sheet in a metal mold for molding the insulating resin substrate; and filling said metal mold with resin to effect the transfer of the electric circuit pattern simultaneously with the molding of the insulating resin substrate.

2. A process for producing an electric circuit board according to claim 1, wherein said electric circuit pattern is composed of a copper pattern.

3. A process for producing an electric circuit board according to claim 1, wherein said electric circuit pattern is formed by selective etching of a metal foil.

* * * * *

UNITED STATES PATENT AND TRADEMARK OFFICE
CERTIFICATE OF CORRECTION

PATENT NO. : 4,980,016
DATED : December 25, 1990
INVENTOR(S) : NAOKO TADA ET AL.

It is certified that error appears in the above-identified patent and that said Letters Patent is hereby corrected as shown below:

On the Title page

Item [56] REFERENCES CITED

U.S. Patent Documents, "2,447,541 8/1948 Sabre et al." should read --2,447,541 8/1948 Sabee et al.-- and "4,367,014 1/1983 Howder" should read --4,367,014 1/1983 Howden--.

COLUMN 1

Line 29, "requires," should read --require,--.
    Line 39, "insultaing" should read --insulating--.

COLUMN 2

Line 32, "EMBODIMENT" should read --EMBODIMENTS--.

COLUMN 3

Line 60, "preferebly" should read --preferably--.

UNITED STATES PATENT AND TRADEMARK OFFICE
CERTIFICATE OF CORRECTION

PATENT NO. : 4,980,016

DATED : December 25, 1990

INVENTOR(S) : NAOKO TADA ET AL.

It is certified that error appears in the above-identified patent and that said Letters Patent is hereby corrected as shown below:

COLUMN 4

Line 47, "tempara-" should read --tempera---.

Signed and Sealed this

Twenty-sixth Day of January, 1993

Attest:

STEPHEN G. KUNIN

*Attesting Officer*   Acting Commissioner of Patents and Trademarks